(12) United States Patent
Carralero et al.

(10) Patent No.: US 6,768,353 B2
(45) Date of Patent: Jul. 27, 2004

(54) PRESCALER METHOD AND APPARATUS

(75) Inventors: Cesar Carralero, Miramar, FL (US); Darrell Davis, Sunrise, FL (US); Raul Salvi, Boca Raton, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 10/208,959

(22) Filed: Jul. 31, 2002

(65) Prior Publication Data

US 2004/0021488 A1 Feb. 5, 2004

(51) Int. Cl.$^7$ .............................................. H03K 21/00
(52) U.S. Cl. ...................................... 327/115; 377/47
(58) Field of Search .............................. 327/115, 117, 327/118, 156, 153, 158, 110, 111, 114; 377/43, 47, 48; 331/16

(56) References Cited

U.S. PATENT DOCUMENTS

| | | | |
|---|---|---|---|
| 4,477,919 A | * 10/1984 | Borras et al. | 377/47 |
| 4,516,251 A | * 5/1985 | Gallup | 377/110 |
| 4,584,698 A | * 4/1986 | Sibigtroth et al. | 377/110 |
| 5,525,916 A | 6/1996 | Gu et al. | 326/98 |

OTHER PUBLICATIONS

H. Pohjonen and H. Ronkainen; "A 1 GHz CMOS Prescaler For RF Synthesizers"; CH2458–8/88/0000–0377; 1988 IEEE, pp. 377–380.
Yaun and Svenson; "Fast CMOS Nonbinary Divider and Counter"; Electronics Letters 24$^{th}$ Jun. 1993; vol. 29 No. 13; pp. 1222–1223.

* cited by examiner

Primary Examiner—Linh M. Nguyen
(74) Attorney, Agent, or Firm—Posz & Bethards, PLC; Charles W. Bethards

(57) ABSTRACT

A prescaler (100) includes a frequency divider (102) having an input node (136) and a divider output (128). The frequency divider is coupled to a clock signal and has a predetermined divisor. Series-coupled delay elements (104, 106, 108) are coupled to the divider output and to the clock signal. Each delay element includes a delayed output (130, 132, 134) and adds a delay equal to the clock period at the delayed output. The prescaler also includes transmission gates (112, 114, 116), each transmission gate coupled between the input node and the delayed output of a corresponding one of the delay elements. When one of the transmission gates is enabled and couples the delayed output of an nth one of the delay elements to the input node, the divider output frequency equals the clock frequency divided by the predetermined divisor plus n.

18 Claims, 3 Drawing Sheets

PRESCALER METHOD AND APPARATUS

FIELD OF THE INVENTION

This invention relates in general to wireless communication systems and equipment, and more specifically to a method and apparatus for realizing a prescaler suitable for use therein.

BACKGROUND OF THE INVENTION

Prescalers are well known and have found their way into many applications in wireless communication systems and equipment. The flexibility desired in modem wireless communication systems has created a need for a prescaler having a multi-modulus divide ratio to achieve a wide range of operating frequencies. Furthermore, the increasingly higher transmission frequencies of modern communication systems have strained the speed limits of prior-art prescalers. In addition, battery life considerations together with stringent size requirements for portable communication devices have brought about an emphatic need for low power consumption.

Thus, what is needed is a method and apparatus for realizing a prescaler that can provide an easily controlled multi-modulus divide ratio and operate at frequencies beyond one GHz, while consuming little power.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

In overview form the present disclosure concerns communications systems that utilize receivers to provide service for communications units or more specifically user thereof operating therein. More particularly various inventive concepts and principles embodied as methods and apparatus for realizing a high frequency power efficient prescaler having an easily controlled multi-modulus divide ratio for use in equipment with such communications systems will be discussed and disclosed. The communications systems of particular interest are those being deployed and developed such as CDMA, W-CDMA, CDMA2000, 2.5G, or 3G systems that utilize carrier frequencies in excess of one GHz although the concepts and principles have application at lower frequencies.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in integrated circuits (ICs) such as custom or application specific ICs. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs, if any, will be limited to the essentials with respect to the principles and concepts employed by the preferred embodiments.

Figure 1:
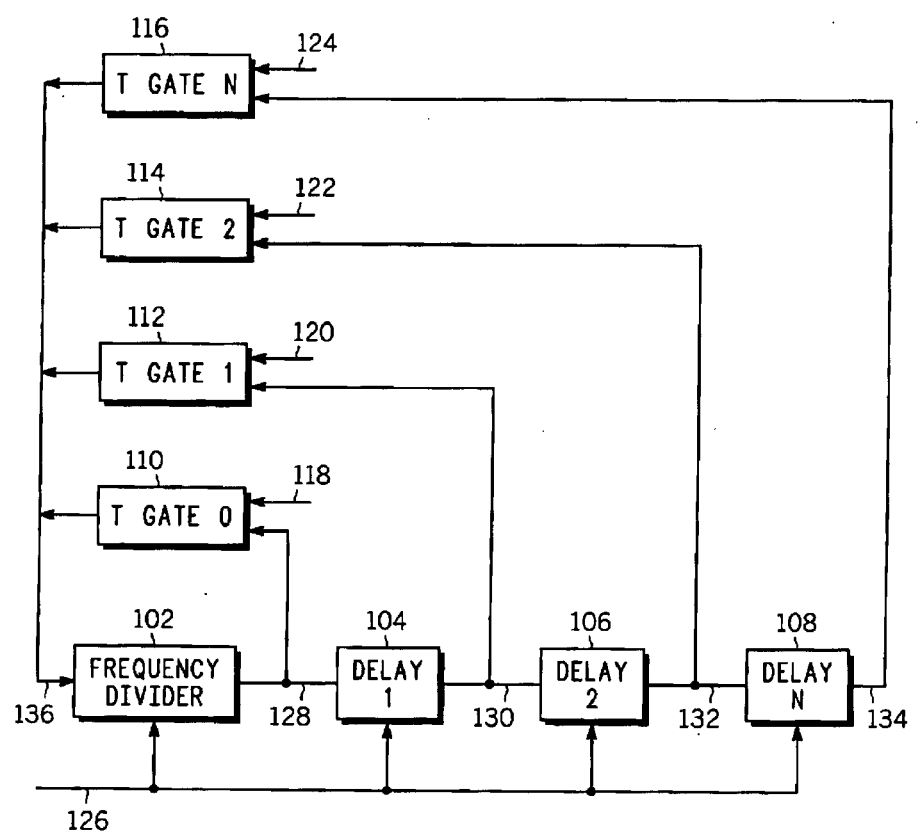
FIG. 1 is an electrical block diagram of a preferred embodiment of an exemplary prescaler in accordance with the present invention.

Referring to FIG. 1, an electrical block diagram of a preferred embodiment of an exemplary prescaler 100 comprises a frequency divider 102 including an input node 136 and a divider output 128. The frequency divider 102 is arranged to divide a clock frequency by a predetermined divisor. The divider output 128 is coupled to a plurality of series-coupled delay elements 104, 106, 108, each comprising a delayed output 130, 132, 134. Each delay element 104, 106, 108 is arranged to add a delay at its delayed output 130, 132, 134 equal to one cycle of the clock frequency coupled to a clock input 126, which is coupled to the delay elements 104, 106, 108, as well as to the frequency divider 102. The prescaler 100 further comprises a plurality of transmission gates 112, 114, 116, each coupled between the input node 136 and the delayed output 130, 132, 134 of a corresponding one of the plurality of series-coupled delay elements 104, 106, 108.

Figure 3:
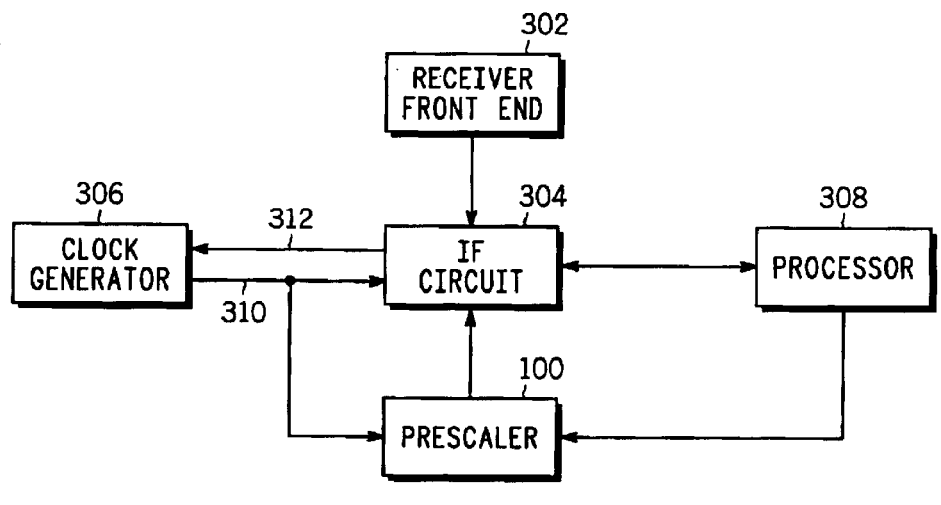
FIG. 3 is an electrical block diagram of an exemplary wireless communication receiver in accordance with the present invention.

The plurality of transmission gates 112, 114, 116 are individually enabled by a corresponding plurality of enable inputs 120, 122, 124, selectively controlled, for example, by a processor 308 (FIG. 3). The prescaler 100 is arranged such that when one of the plurality of transmission gates 112, 114, 116 is enabled and couples the delayed output of an nth one of the plurality of series-coupled delay elements 104, 106, 108 to the input node 136, the divider output 128 produces a signal having a frequency equal to the clock frequency divided by the predetermined divisor plus n. For example, when the predetermined divisor of the frequency divider 102 is four, and the second transmission gate 114 is enabled at enable input 122, thereby coupling the delayed output 132 of the second delay element 106 to the input node 136, the divider output 128 produces a signal having a frequency equal to the clock frequency divided by six (i.e., four plus two).

In one embodiment, an additional transmission gate 110 is coupled between the divider output 128 and the input node 136. In this embodiment, the additional transmission gate 110 is selectively enabled through the enable input 118 by, for example, the processor 308 (see FIG. 3). When the transmission gate 110 couples the divider output 128 to the input node 136, the divider output 128 produces a signal having a frequency equal to the clock frequency divided by the predetermined divisor. (In this event, n=0, so the predetermined divisor is not changed.)

The prescaler 100 is preferably arranged such that only one of the transmission gates 110–116 can be enabled at any time. This preferably is accomplished through known software techniques and instructions in the processor 308. Alternatively, additional logic can be added to the prescaler 100 to allow only one of the enable inputs 118–124 to be active at a time. It will be appreciated that any total number (N) of delay elements can be present in the prescaler 100, advantageously providing the prescaler 100 with great flexibility. It will be further appreciated that the prescaler 100 can be fabricated as an integrated circuit.

A further advantage of the prescaler architecture depicted is that it allows different divide ratios to be obtained easily and quickly with simple control circuits, leading to fast operation of fractional division. One can, for example, create fractional divide ratios such as 128.5 by switching between 128 & 129 at exactly half rate, or between 128 & 129 at ⅓ rate to create a divide ratio of 128.333. This has many benefits in a phase-locked loop (PLL) system, and makes it possible to quickly switch divide ratios and use only the amount of current and circuit blocks necessary for a particular desired divide ratio.

Figure 2:
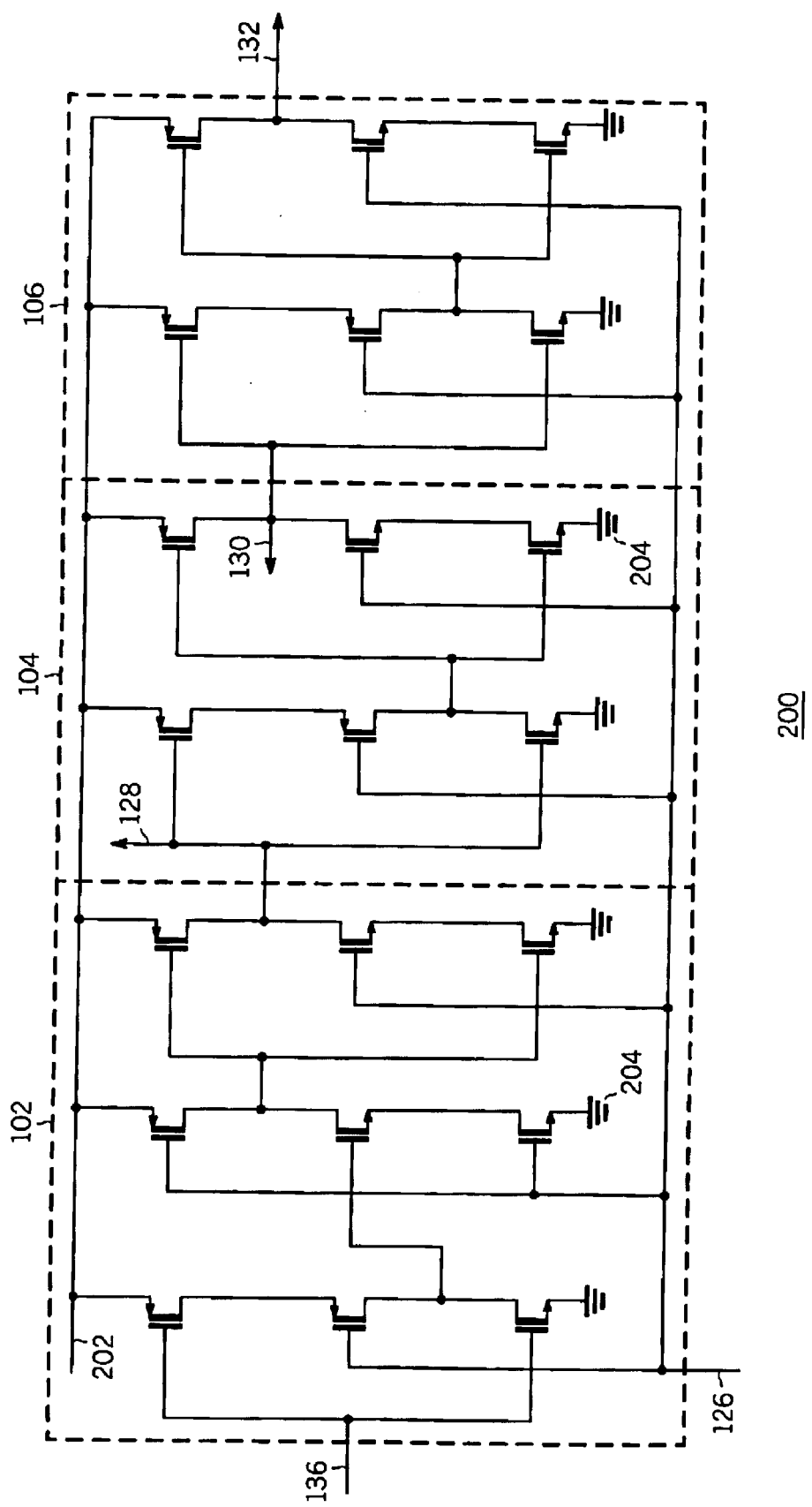
FIG. 2 is an electrical schematic diagram of a portion of the exemplary prescaler in accordance with the present invention.

Referring to FIG. 2, an electrical schematic diagram of a portion 200 of the exemplary prescaler 100 in accordance with the present invention comprises the frequency divider 102, coupled to the first and second delay elements 104, 106. In this example, the frequency divider 102 has a predetermined divisor equal to four. A power supply line 202 and common nodes 204 are also depicted, as are the input node 136, the divider output 128, and the first and second delayed outputs 130, 132. The portion 200 preferably utilizes dynamic CMOS elements to minimize power consumption. The arrangement depicted in FIGS. 1 and 2 advantageously allows operation of the low-power CMOS prescaler at frequencies well beyond one GHz, making it ideal for use in modern portable wireless communication devices. It will be appreciated that the specific circuitry depicted in FIG. 2 is an example only. Many other configurations, predetermined divisors, and circuit arrangements can be utilized to construct the exemplary prescaler 100 in accordance with the present invention.

Referring to FIG. 3, an electrical block diagram of an exemplary wireless communication receiver 300 in accordance with the present invention comprises a conventional receiver front end 302 for receiving a wireless communication signal. The wireless communications signal is coupled to a conventional intermediate frequency (IF) circuit 304 for down-converting the wireless communication signal to an IF frequency using known mixing techniques where the mixer is supplied with a local oscillator or clock signal. The IF circuit also provides a control signal 312 to a conventional clock generator 306, preferably a voltage controlled oscillator (VCO). The clock generator 306 is for supplying a clock signal having or operating at a clock frequency that corresponds to the control signal. The clock signal 310 is coupled to the IF circuit and utilized for the down-converting process. A prescaler 100 in accordance with the present invention is coupled to the clock signal and provides a prescaler output signal that is coupled to the IF circuit 304 and used to generate the control signal, preferably by way of a phase comparison as is known of the prescaler output signal or derivative thereof and a reference signal from a reference source (not shown). A conventional processor 308 is coupled to the IF circuit 304 and coupled to the prescaler 100 for controlling the same. In one embodiment, the processor 308 controls or sets divide ratios for the prescaler 100 and possibly additional dividers (not shown) so that the clock generator 306, the prescaler 100 a reference source and phase comparator (not shown) but part of the IF circuit 304 operate as a known phase-locked loop (PLL) to set or establish the clock signal frequency according to the frequency required to down-convert a given carrier frequency of the wireless communications signal to a known and predetermined IF frequency. The clock signal with the clock frequency is utilized by the IF circuit 304 for down-converting the wireless communication signal. It will be appreciated that, in some embodiments, the processor 308 can be replaced by hardware logic. It will be further appreciated that, alternatively, all or part of the receiver front end 302, the IF circuit 304, the processor 308, the clock generator 306, and the prescaler 100 can be combined and fabricated as one or more integrated circuits.

Figure 4:
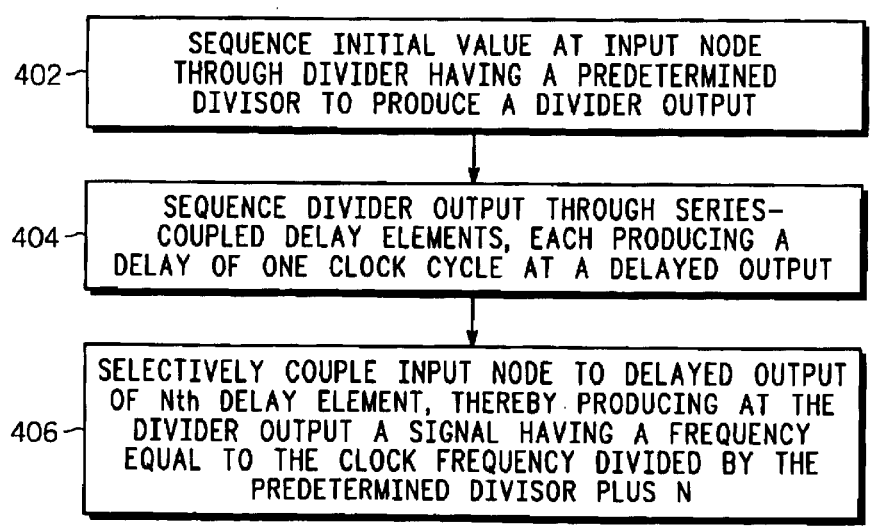
FIG. 4 is a flow diagram depiction operation of the exemplary prescaler in accordance with the present invention.

Referring to FIG. 4, a flow diagram 400 depicts operation of the exemplary prescaler 100 in accordance with the present invention. The flow begins with the prescaler 100 sequencing 402 an initial value at the input node 136 of the frequency divider 102 through the frequency divider 102 to produce a divider output signal at the divider output 128. Next, the prescaler 100 sequences 404 the divider output signal through at least some of the plurality of series-coupled delay elements 104, 106, 108. The prescaler 100 selectively couples 406 to the input node 136 a delayed output signal of an nth one of the plurality of series-coupled delay elements 104, 106, 108, thereby producing at the divider output 128 a divider output signal having a frequency equal to the clock frequency divided by the predetermined divisor plus n.

Thus, it should be clear from the preceding disclosure that the present invention provides a method and apparatus for realizing a prescaler that provides an easily controlled multi-modulus divide ratio, and that advantageously can operate at frequencies beyond one GHz, while consuming little power.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A prescaler arranged to be driven by a clock signal operating at a clock frequency, the prescaler comprising:
   a frequency divider comprising an input node and a divider output, the frequency divider coupled to the clock signal and having a predetermined divisor;
   a plurality of series-coupled delay elements coupled to the divider output and coupled to the clock signal, each delay element including a delayed output and arranged to add a delay equal to one cycle of the clock frequency at the delayed output; and a plurality of transmission gates, each gate coupled between the input node and the delayed output of a corresponding one of the plurality of series-coupled delay elements, wherein the prescaler is arranged such that when one of the plurality of transmission gates is enabled and couples the delayed output of an nth one of the plurality of series-coupled delay elements to the input node, the divider output produces a signal having a frequency equal to the clock frequency divided by the predetermined divisor plus n.

2. The prescaler of claim 1, further comprising an additional transmission gate coupled between the divider output and the input node, wherein the prescaler is further arranged such that when the additional transmission gate couples the divider output to the input node, the divider output produces a signal having a frequency equal to clock frequency divided by the predetermined divisor.

3. The prescaler of claim 1, wherein the frequency divider and the plurality of series-coupled delay elements are realized through dynamic CMOS elements.

4. The prescaler of claim 1, arranged such that only one of the plurality of transmission gates is enabled at any time.

5. A method for operating a prescaler driven by a clock signal operating at a clock frequency, the prescaler including a frequency divider comprising a divider output and having a predetermined divisor, and further including a plurality of series-coupled delay elements, each delay element adding a delay equal to one cycle of the clock frequency at a delayed output, the method comprising:

sequencing an initial value at an input node of the frequency divider through the frequency divider to produce a divider output signal at the divider output;

sequencing the divider output signal through the plurality of series-coupled delay elements; and selectively coupling to the input node a delayed output signal of an nth one of the plurality of series-coupled delay elements, thereby producing at the divider output a divider output signal having a frequency equal to the clock frequency divided by the predetermined divisor plus n.

6. The method of claim 5, further comprising selectively coupling the divider output to the input node, thereby producing at the divider output a signal having a frequency equal to the clock frequency divided by the predetermined divisor.

7. A wireless communication receiver, comprising:

a receiver front end for receiving a wireless communication signal;

an intermediate frequency (IF) circuit coupled to the receiver front end for down-converting the wireless communication signal to an IF frequency and for providing a control signal;

a clock generator coupled to the control signal for supplying a clock signal operating at a clock frequency corresponding to the control signal, the clock signal coupled to and utilized by the IF circuit for the down-converting; and a prescaler coupled to the clock signal for providing a prescaler output signal that is coupled to the IF circuit and used to generate the control signal, wherein the prescaler comprises:

a frequency divider comprising an input node and a divider output, the frequency divider coupled to the clock signal and having a predetermined divisor;

a plurality of series-coupled delay elements coupled to the divider output and coupled to the clock signal, each delay element including a delayed output and arranged to add a delay equal to one cycle of the clock frequency at the delayed output;

a plurality of transmission gates, each gate coupled between the input node and the delayed output of a corresponding one of the plurality of series-coupled delay elements, and wherein the prescaler is arranged such that when one of the plurality of transmission gates is enabled and couples the delayed output of an nth one of the plurality of series-coupled delay elements to the input node, the divider output produces the prescaler output signal having a frequency equal to the clock frequency divided by the predetermined divisor plus n.

8. The wireless communication receiver of claim 7, further comprising an additional transmission gate coupled between the divider output and the input node, wherein the prescaler is further arranged such that when the additional transmission gate couples the divider output to the input node, the divider output produces a signal having a frequency equal to the clock frequency divided by the predetermined divisor.

9. The wireless communication receiver of claim 7, wherein the frequency divider and the plurality of series-coupled delay elements are realized through dynamic CMOS elements.

10. The wireless communication receiver of claim 7, arranged such that only one of the plurality of transmission gates is enabled at any time.

11. An integrated circuit, arranged to be driven by a clock signal operating at a clock frequency, the integrated circuit comprising:

a frequency divider comprising an input node and a divider output, the frequency divider arranged to be coupled to the clock signal and having a predetermined divisor;

a plurality of series-coupled delay elements coupled to the divider output and coupled to the clock signal, each delay element including a delayed output and arranged to add a delay equal to one cycle of the clock frequency at the delayed output; and a plurality of transmission gates, each gate coupled between the input node and the delayed output of a corresponding one of the plurality of series-coupled delay elements, wherein the integrated circuit is arranged such that when one of the plurality of transmission gates is enabled and couples the delayed output of an nth one of the plurality of series-coupled delay elements to the input node, the divider output produces a signal having a frequency equal to the clock frequency divided by the predetermined divisor plus n.

12. The integrated circuit of claim 11, further comprising an additional transmission gate coupled between the divider output and the input node, wherein the integrated circuit is further arranged such that when the additional transmission gate couples the divider output to the input node, the divider output produces a signal having a frequency equal to clock frequency divided by the predetermined divisor.

13. The integrated circuit of claim 11, wherein the frequency divider and the plurality of series-coupled delay elements are realized through dynamic CMOS elements.

14. The integrated circuit of claim 11, arranged such that only one of the plurality of transmission gates is enabled at any time.

15. The prescaler of claim 1 wherein when an alternating one of the plurality of transmission gates is enabled, the divider output produces a signal having a frequency equal to the clock frequency divided by a fractional divide ratio.

16. The method of claim 5 wherein the selectively coupling includes alternately coupling to the input node alternating delayed output signals corresponding to alternating ones of the plurality of series-coupled delay elements, thereby producing at the divider output a divider output signal having a frequency equal to the clock frequency divided by a fractional divide ratio.

17. The wireless communication receiver of claim 7 wherein the prescaler is arranged for enabling alternating ones of the plurality of transmission gates and the divider output produces a signal having a frequency equal to the clock frequency divided by a fractional divide ratio.

18. The integrated circuit of claim 11 wherein when an alternating one of the plurality of transmission gates is enabled the divider output produces a signal having a frequency equal to the clock frequency divided by a fractional divide ratio.

* * * * *